(12) United States Patent
Ishihara et al.

(10) Patent No.: US 11,680,339 B2
(45) Date of Patent: Jun. 20, 2023

(54) METHOD OF MANUFACTURING GROUP III NITRIDE SEMICONDUCTOR SUBSTRATE, GROUP III NITRIDE SEMICONDUCTOR SUBSTRATE, AND BULK CRYSTAL

(71) Applicant: FURUKAWA CO., LTD., Tokyo (JP)

(72) Inventors: Yujiro Ishihara, Tochigi (JP); Hiroki Goto, Tochigi (JP); Shoichi Fuda, Tochigi (JP); Tomohiro Kobayashi, Tochigi (JP); Hitoshi Sasaki, Tochigi (JP)

(73) Assignee: FURUKAWA CO., LTD., Tokyo (JP)

(*) Notice: Subject to any disclaimer, the term of this patent is extended or adjusted under 35 U.S.C. 154(b) by 770 days.

(21) Appl. No.: 16/497,837

(22) PCT Filed: Mar. 19, 2018

(86) PCT No.: PCT/JP2018/010717
§ 371 (c)(1),
(2) Date: Sep. 26, 2019

(87) PCT Pub. No.: WO2018/180673
PCT Pub. Date: Oct. 4, 2018

(65) Prior Publication Data
US 2020/0024770 A1 Jan. 23, 2020

(30) Foreign Application Priority Data
Mar. 28, 2017 (JP) .............................. JP2017-062361

(51) Int. Cl.
*C30B 29/40* (2006.01)
*C23C 16/34* (2006.01)
(Continued)

(52) U.S. Cl.
CPC ............ *C30B 29/406* (2013.01); *C23C 16/34* (2013.01); *C30B 25/183* (2013.01);
(Continued)

(58) Field of Classification Search
None
See application file for complete search history.

(56) References Cited

U.S. PATENT DOCUMENTS 7,621,998 B2  11/2009  Lee
7,723,217 B2   5/2010  Lee
(Continued)

FOREIGN PATENT DOCUMENTS

EP       3597797 A1    1/2020
JP     2004119807 A    4/2004
(Continued)

OTHER PUBLICATIONS

International Search Report dated May 29, 2018 filed in PCT/JP2018/010717.
(Continued)

*Primary Examiner* — Guinever S Gregorio
(74) *Attorney, Agent, or Firm* — Rankin, Hill & Clark LLP

(57) ABSTRACT

There is provided a method of manufacturing a group III nitride semiconductor substrate including: a fixing step S10 of fixing abase substrate, which includes a group III nitride semiconductor layer having a semipolar plane as a main surface, to a susceptor; a first growth step S11 of forming a first growth layer by growing a group III nitride semiconductor over the main surface of the group III nitride semiconductor layer in a state in which the base substrate is fixed to the susceptor using an HVPE method; a cooling step S12 of cooling a laminate including the susceptor, the base substrate, and the first growth layer; and a second growth step S13 of forming a second growth layer by growing a group III nitride semiconductor over the first growth layer in a state in which the base substrate is fixed to the susceptor using the HVPE method.

5 Claims, 6 Drawing Sheets

(51) Int. Cl.
*C30B 25/18* (2006.01)
*H01L 21/02* (2006.01)
*H01L 21/78* (2006.01)
*C01B 21/06* (2006.01)

(52) U.S. Cl.
CPC ........ *C30B 25/186* (2013.01); *H01L 21/0242* (2013.01); *H01L 21/0254* (2013.01); *H01L 21/0262* (2013.01); *H01L 21/02458* (2013.01); *H01L 21/02694* (2013.01); *H01L 21/7813* (2013.01); *C01B 21/06* (2013.01); *Y10T 428/219* (2015.01)

(56) References Cited

U.S. PATENT DOCUMENTS

| | | | |
|---|---|---|---|
| 8,269,251 | B2 | 9/2012 | Fujito |
| 9,112,096 | B2 | 8/2015 | Fujito |
| 9,209,018 | B2 | 12/2015 | Beaumont |
| 9,627,581 | B2 | 4/2017 | Choe |
| 2006/0108573 | A1 | 5/2006 | Lee |
| 2007/0176199 | A1 | 8/2007 | Shibata |
| 2008/0067543 | A1 | 3/2008 | Shin |
| 2009/0155986 | A1 | 6/2009 | Lee |
| 2010/0148212 | A1 | 6/2010 | Fujito |
| 2010/0322841 | A1* | 12/2010 | Okahisa ................ C30B 29/406 117/97 |
| 2012/0305983 | A1 | 12/2012 | Fujito |
| 2013/0001586 | A1* | 1/2013 | Beaumont .......... H01L 21/0254 257/E29.105 |
| 2013/0264606 | A1* | 10/2013 | Kubo .................... C30B 29/403 438/46 |
| 2013/0320394 | A1 | 12/2013 | Fujito |
| 2013/0323490 | A1* | 12/2013 | D'Evelyn .............. C30B 19/02 428/220 |
| 2015/0357521 | A1 | 12/2015 | Choe |
| 2020/0132750 | A1 | 4/2020 | Goto et al. |

FOREIGN PATENT DOCUMENTS

| | | | |
|---|---|---|---|
| JP | 2006143581 | A | 6/2006 |
| JP | 2007197276 | A | 8/2007 |
| JP | 2008069067 | A | 3/2008 |
| JP | 2009143796 | A | 7/2009 |
| JP | 2012015545 | A | 1/2012 |
| JP | 2012136414 | A | 7/2012 |
| JP | 2013035696 | A | 2/2013 |
| JP | 2013040059 | A * | 2/2013 |
| JP | 2013040059 | A | 2/2013 |
| JP | 2013049621 | A | 3/2013 |
| JP | 2014520748 | A | 8/2014 |
| JP | 2016012717 | A | 1/2016 |

OTHER PUBLICATIONS

Extended European Search Report (EESR) dated Nov. 20, 2020 issued in the corresponding European Patent Application No. 18774304.2.

* cited by examiner

US 11,680,339 B2

METHOD OF MANUFACTURING GROUP III NITRIDE SEMICONDUCTOR SUBSTRATE, GROUP III NITRIDE SEMICONDUCTOR SUBSTRATE, AND BULK CRYSTAL

TECHNICAL FIELD

The present invention relates to a method of manufacturing a group III nitride semiconductor substrate, a group III nitride semiconductor substrate, and a bulk crystal.

BACKGROUND ART

A substrate including a group III nitride semiconductor layer having a semipolar plane as a main surface has been developed. A related technique is disclosed in Patent Document 1.

Patent Document 1 discloses a substrate having a layer which is formed of a group III nitride semiconductor and in which the normal of the main surface is inclined in the range of 5° to 17° in the +c axis direction from the [11-22] axis.

As a manufacturing method therefor, a method of forming a layer, such as that described above, by epitaxially growing a group III nitride semiconductor over a base substrate (a sapphire substrate, a group III nitride semiconductor substrate, or the like) whose main surface has a predetermined plane orientation using a metal organic chemical vapor deposition (MOCVD) method, a molecular beam epitaxy method, a hydride vapor phase epitaxy (HVPE) method, or the like is disclosed. In addition, it is disclosed that using the HVPE method is preferable since a thick film can be grown.

However, Patent Document 1 discloses only an example in which a group III nitride semiconductor is grown using the MOCVD method, but does not disclose an example in which a group III nitride semiconductor is grown as a thick film using the HVPE method.

RELATED DOCUMENT

Patent Document

[Patent Document 1] Japanese Unexamined Patent Application Publication No. 2016-12717

SUMMARY OF THE INVENTION

Technical Problem

In order to improve manufacturing efficiency and the like, it is desirable to grow a group III nitride semiconductor having a semipolar plane as a main surface as a thick film. This is difficult to achieve in the case of the MOCVD method in which the growth rate is not sufficient. In addition, as a result of examining means using the HVPE method, the present inventors have found the following new problems.

In a case where a group III nitride semiconductor having a semipolar plane as a main surface is continuously grown and thickened by the HVPE method, the layer of the grown group III nitride semiconductor is likely to be broken. In such a case, problems, such as a sufficiently large aperture cannot be secured, occur.

It is an object of the present invention to provide a new technique for growing a group III nitride semiconductor having a semipolar plane as a main surface.

Solution to Problem

According to the present invention, there is provided a method of manufacturing a group III nitride semiconductor substrate including: a fixing step of fixing a base substrate, which includes a group III nitride semiconductor layer having a semipolar plane as a main surface, to a susceptor; a first growth step of forming a first growth layer by growing a group III nitride semiconductor over the main surface of the group III nitride semiconductor layer in a state in which the base substrate is fixed to the susceptor using a hydride vapor phase epitaxy (HVPE) method; a cooling step of cooling a laminate including the susceptor, the base substrate, and the first growth layer after the first growth step; and a second growth step of forming a second growth layer by growing a group III nitride semiconductor over the first growth layer in a state in which the base substrate is fixed to the susceptor using the HVPE method after the cooling step.

In addition, according to the present invention, there is provided a group III nitride semiconductor substrate including a group III nitride semiconductor layer having a semipolar plane as a main surface, in which a maximum diameter of the group III nitride semiconductor layer is ϕ50 mm or more, and a thickness of the group III nitride semiconductor layer is 100 μm or more.

In addition, according to the present invention, there is provided a bulk crystal including a layer that is formed of single crystals of a group III nitride semiconductor, has a semipolar plane as a main surface, and has a maximum diameter of ϕ50 mm or more and a thickness of 600 μm or more.

Advantageous Effects of Invention

According to the present invention, a new technique for growing a group III nitride semiconductor having a semipolar plane as a main surface is realized.

BRIEF DESCRIPTION OF THE DRAWINGS

The objects described above, other objects, characteristics, and advantages will be made clearer from preferred embodiments described below and the following accompanying drawings.

DESCRIPTION OF EMBODIMENTS

Hereinafter, embodiments of a group III nitride semiconductor substrate and a method of manufacturing a group III nitride semiconductor substrate of the present invention will be described with reference to the diagrams. The diagrams are merely schematic diagrams for illustrating the configuration of the invention, and the sizes, shapes, and numbers of respective members, the ratios of the sizes of different members, and the like are not limited to those illustrated.

Figure 1:
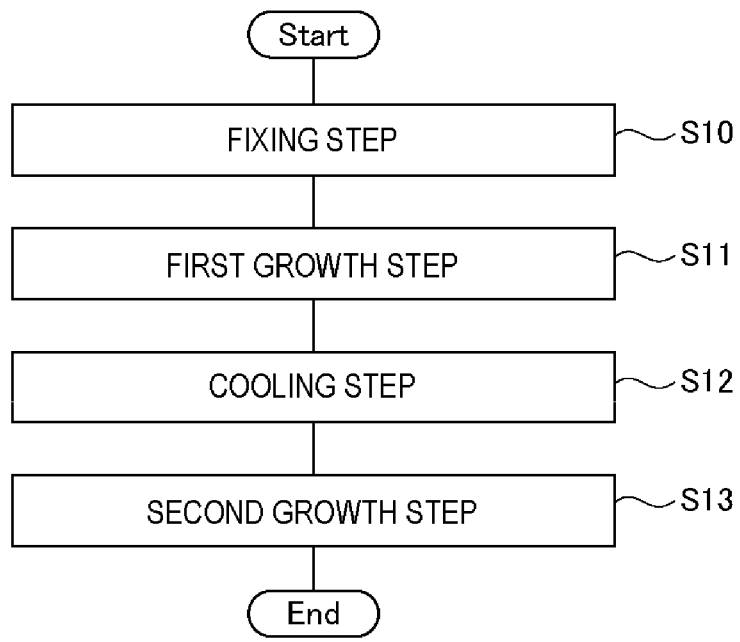
FIG. 1 is a flowchart showing an example of the flow of the process of a method of manufacturing a group III nitride semiconductor substrate of the present embodiment.

The flowchart of FIG. 1 shows an example of the flow of the process of the method of manufacturing a group III nitride semiconductor substrate of the present embodiment. As shown in the diagram, in the method of manufacturing a group III nitride semiconductor substrate of the present embodiment, a fixing step S10, a first growth step S11, a cooling step S12, and a second growth step S13 are performed in this order.

Figure 2:
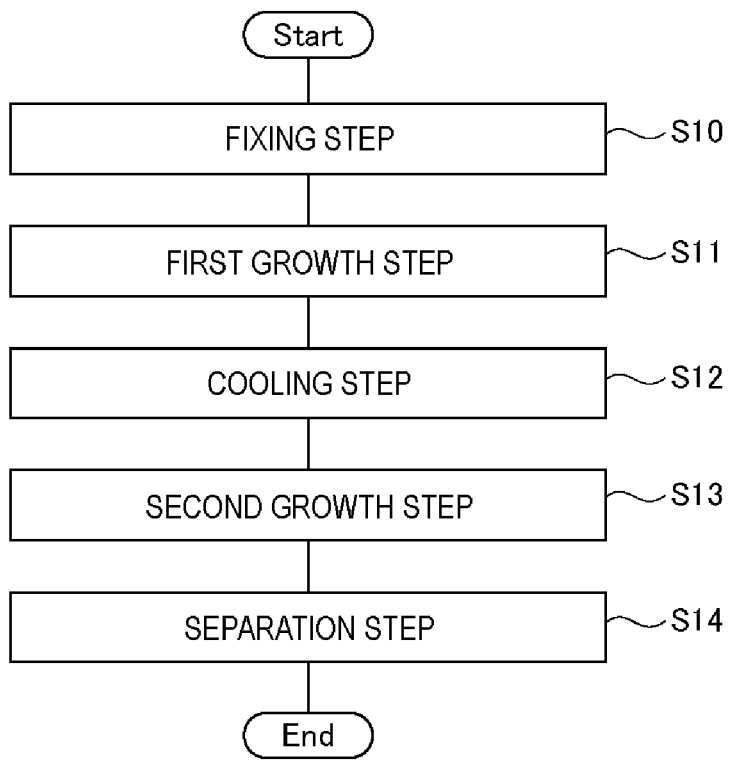
FIG. 2 is a flowchart showing another example of the flow of the process of the method of manufacturing a group III nitride semiconductor substrate of the present embodiment.

The flowchart of FIG. 2 shows another example of the flow of the process of the method of manufacturing a group III nitride semiconductor substrate of the present embodiment. This example is different from the example shown in FIG. 1 in that a separation step S14 is performed after the second growth step S13.

Hereinafter, each step will be described using the flowcharts of FIGS. 1 and 2 and the process diagram of FIG. 3.

In the fixing step S10 shown in FIGS. 1 and 2, a base substrate is fixed to a susceptor. For example, a base substrate 10 as shown in FIG. 3-1 is fixed to a susceptor 20 as shown in FIG. 3-2.

First, the base substrate 10 will be described. The base substrate 10 includes a group III nitride semiconductor layer 12 having a semipolar plane as a main surface. The group III nitride semiconductor layer 12 is, for example, a GaN layer.

The base substrate 10 may be a laminate including a layer other than the group III nitride semiconductor layer 12, or may be a single layer of only the group III nitride semiconductor layer 12. As an example of a laminate, for example, as shown in FIG. 3-1, a laminate is exemplified in which a sapphire substrate 11, a buffer layer (not shown in the diagram), and the group III nitride semiconductor layer 12 are laminated in this order. However, the present invention is not limited thereto. For example, the sapphire substrate 11 may be replaced with other different types of substrates. The buffer layer may not be included. Another layer may be included.

The semipolar plane is a plane other than a polar plane and a nonpolar plane. The main surface (exposed surface in the diagram) of the group III nitride semiconductor layer 12 may be a semipolar plane on the +c side (semipolar plane on the Ga polarity side: semipolar plane which is represented by Miller index (hkml) and in which l is greater than 0), or may be a semipolar plane on the −c side (semipolar plane on the N polarity side: semipolar plane which is represented by Miller index (hkml) and in which l is less than 0).

The method of manufacturing the base substrate 10 is not particularly limited, and any technique can be adopted. For example, the group III nitride semiconductor layer 12 may be formed by epitaxially growing a group III nitride semiconductor over the sapphire substrate 11 having a predetermined plane orientation with a buffer layer interposed therebetween using the MOCVD method. In this case, by adjusting the plane orientation of the main surface of the sapphire substrate 11, the presence or absence of nitriding treatment at the time of heat treatment performed on the sapphire substrate 11 before forming the buffer layer, growth conditions at the time of forming the buffer layer, growth conditions at the time of forming the group III nitride semiconductor layer 12, processing for forming a metal film and a metal carbide film by supplying a metal-containing gas (for example, trimethylaluminum or triethylaluminum) onto the main surface of the sapphire substrate 11, growth conditions at the time of forming the buffer layer or the group III nitride semiconductor layer 12, and the like, it can be adjusted whether or not the main surface exposes a desired semipolar plane on the N polarity side or the Ga polarity side.

As another example of the method of manufacturing the base substrate 10, a group III nitride semiconductor layer (base substrate 10) having a desired semipolar plane as a main surface may be obtained by processing (for example, slicing) a group III nitride semiconductor layer obtained by c-plane growth. In addition, the technique disclosed in Patent Document 1 may be adopted.

The maximum diameter of the group III nitride semiconductor layer 12 is, for example, φ50 mm or more and φ6 inches or less. The thickness of the group III nitride semiconductor layer 12 is, for example, 50 nm or more and 500 μm or less. The diameter of the sapphire substrate 11 is, for example, φ50 mm or more and φ6 inches or less. The thickness of the sapphire substrate 11 is, for example, 100 μm or more and 10 mm or less.

Next, the susceptor 20 will be described. The susceptor 20 has a characteristic that the susceptor 20 is not deformed by the warping force of the base substrate 10 that can be warped by heating in the first growth step S11 or the second growth step S13. As examples of such a susceptor 20, a carbon susceptor, a silicon carbide coated carbon susceptor, a boron nitride coated carbon susceptor, a quartz susceptor, and the like are exemplified. However, the present invention is not limited thereto.

Next, a method of fixing the base substrate 10 to the susceptor 20 will be described. In the present embodiment, as shown in FIG. 3-2, the bottom surface of the base substrate 10 (bottom surface of the sapphire substrate 11) is fixed to the surface of the susceptor 20. Therefore, deformation of the base substrate 10 is suppressed. As the fixing method, a method is required in which peeling does not occur due to heating in the first growth step S11 or the second growth step S13, the warping force of the base substrate 10 that can be warped by the heating, or the like. For example, a fixing method using an alumina-based adhesive, a carbon-based adhesive, a zirconia-based adhesive, a silica-based adhesive, a nitride-based adhesive, and the like is exemplified.

Figures 1, 3:
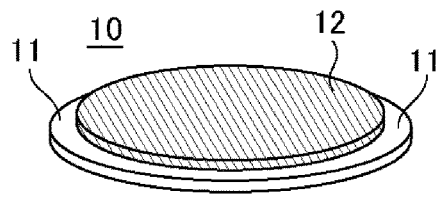
FIG. 3 is a process diagram showing an example of the flow of the process of a method of manufacturing a group III nitride semiconductor substrate of the present embodiment.
Figures 2, 3:
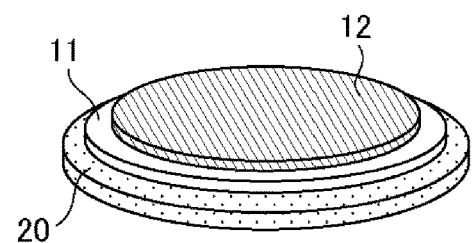
Figure 3:
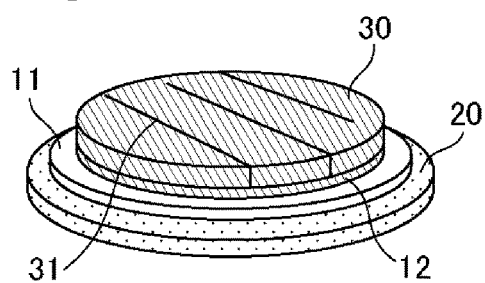

Referring back to FIGS. 1 and 2, in the first growth step S11 after the fixing step S10, as shown in FIG. 3-3, a group III nitride semiconductor is grown over the main surface of the group III nitride semiconductor layer 12 in a state in which the base substrate 10 is fixed to the susceptor 20 using the HVPE method. As a result, a first growth layer 30 formed of single crystal group III nitride semiconductor is formed. For example, GaN is epitaxially grown under the following growth conditions to form a GaN layer (first growth layer 30).

Growth temperature: 900° C. to 1100° C.

Growth time: 1 h to 50 h

V/III ratio: 1 to 20

Growth film thickness: 100 μm to 10 mm

In the first growth step S11, polycrystalline group III nitride semiconductors are formed along the side surfaces of the laminate including the susceptor 20, the base substrate 10, and the first growth layer 30. The polycrystalline group III nitride semiconductors are attached to the entirety or most of the side surface of the laminate. The attached polycrystalline group III nitride semiconductors are connected to each other to form an annular shape. Then, the laminate is held inside the annular polycrystalline group III nitride semiconductor.

In the first growth step S11, the polycrystalline group III nitride semiconductor can be formed over the bottom surface of the susceptor 20 in addition to the side surface of the laminate. The polycrystalline group III nitride semiconductors are attached to the entirety or most of the side surface of the laminate and the bottom surface of the susceptor 20. The attached polycrystalline group III nitride semiconductors are connected to each other to form a cup shape. Then, the laminate is held inside the cup shaped polycrystalline group III nitride semiconductor.

Referring back to FIGS. 1 and 2, in the cooling step S12 after the first growth step S11, the laminate including the susceptor 20, the base substrate 10, and the first growth layer 30 is cooled. The purpose of cooling herein is to reduce stress by generating a crack in the first growth layer 30 using strain (stress) generated due to the difference in linear expansion coefficient between the first growth layer 30 and the sapphire substrate 11. It is desirable to reduce the stress before the second growth step S13. The cooling method is not particularly limited as long as the purpose can be achieved. For example, after the first growth step S11, the laminate may be temporarily taken out of the HVPE apparatus and cooled to the room temperature.

As shown in FIG. 3-3, in the first growth layer 30 after the cooling step S12, a crack (a gap, a chap, or the like) 31 is present. As shown in the diagram, the crack 31 may be present on the surface of the first growth layer 30. Alternatively, the crack 31 may be generated during the first growth step S11, or may be generated during the cooling step S12.

Figures 3, 4:
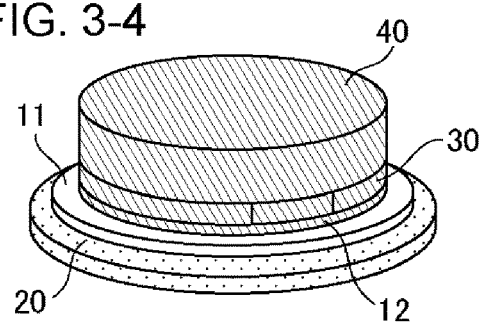
FIG. 4 is a schematic diagram for explaining the characteristics of the group III nitride semiconductor substrate of the present embodiment.

Referring back to FIGS. 1 and 2, in the second growth step S13 after the cooling step S12, as shown in FIG. 3-4, a group III nitride semiconductor is grown over the first growth layer 30 in a state in which the base substrate 10 is fixed to the susceptor 20 using the HVPE method. As a result, a second growth layer 40 formed of single crystal group III nitride semiconductor is formed. For example, GaN is epitaxially grown under the following growth conditions to form a GaN layer (second growth layer 40). The growth conditions for forming the first growth layer 30 and the growth conditions for forming the second growth layer 40 may be the same or different.

Growth temperature: 900° C. to 1100° C.

Growth time: 1 h to 50 h

V/III ratio: 1 to 20

Growth film thickness: 100 μm to 10 mm

In the second growth step S13, the second growth layer 40 is formed over the first growth layer 30 in a state in which the annular polycrystalline group III nitride semiconductor formed in the first growth step S11 remains. The purpose of leaving the annular polycrystalline group III nitride semiconductor is to suppress separation of the first growth layer 30, which can be separated into plural portions due to the crack 31, by holding the first growth layer 30 from the outer periphery. The separation of the first growth layer 30 into plural portions worsens the plane orientation deviation, the handleability, the workability, and the like of each of the plural portions. In addition, in a case where some components are lost or shattered, there is a possibility that the original shape cannot be reproduced. According to the present embodiment, since it is possible to suppress the plane orientation deviation or the separation, the inconvenience can be suppressed.

Although the entire polycrystalline group III nitride semiconductor formed in the first growth step S11 may remain as it is, the entire polycrystalline group III nitride semiconductor formed in the first growth step S11 may not necessarily remain as long as the above object can be achieved. That is, a part of the polycrystalline group III nitride semiconductor may be removed.

Also in the second growth step S13, a polycrystalline group III nitride semiconductor is formed. The polycrystalline group III nitride semiconductor can be formed along the side surface of the laminate including the susceptor 20, the base substrate 10, the first growth layer 30, and the second growth layer 40 and the bottom surface of the susceptor 20.

In the second growth step S13, a group III nitride semiconductor is grown over the surface of the first growth layer 30 in which the crack 31 is present using the HVPE method, thereby forming the second growth layer 40. In this case, the growth plane (surface of the first growth layer 30) is discontinuous at the crack 31 portion. The group III nitride semiconductors grown from the first surface region and the second surface region, which are separated from each other with the crack 31 as a boundary, are bonded to each other to be integrated as the growth proceeds.

Referring back to FIG. 2, in the separation step S14 after the second growth step S13, a group III nitride semiconductor substrate having at least one of the first growth layer 30 or the second growth layer 40 is separated from the susceptor 20. For example, a group III nitride semiconductor substrate having at least one of the first growth layer 30 or the second growth layer 40 may be taken out by slicing the laminate including the susceptor 20, the base substrate 10, the first growth layer 30, and the second growth layer 40. In addition, the group III nitride semiconductor substrate may be taken out by a method, such as grinding or polishing from the susceptor 20 side and combustion, decomposition, or dissolution of the susceptor 20.

The group III nitride semiconductor substrate may be a part or all of the first growth layer 30, or may be a part or all of the second growth layer 40, or may be a part or all of the first growth layer 30 and a part or all of the second growth layer 40.

According to the method of manufacturing a group III nitride semiconductor substrate of the present embodiment described above, it is possible to manufacture a group III nitride semiconductor substrate having a group III nitride semiconductor layer having a semipolar plane as a main surface. The group III nitride semiconductor substrate may be a group III nitride semiconductor substrate taken out in the separation step S14, or may be a laminate including the susceptor 20, the base substrate 10, the first growth layer 30, and the second growth layer 40 after the second growth step S13 and before the separation step S14.

Next, the effect of the method of manufacturing a group III nitride semiconductor substrate of the present embodiment and the features of the group III nitride semiconductor substrate of the present embodiment manufactured by the manufacturing method will be described.

According to the method of manufacturing a group III nitride semiconductor substrate of the present embodiment, the second growth layer 40 can be formed by epitaxially growing the semiconductor over the first growth layer 30 with reduced stress (second growth step S13). For this reason, compared with a case where the first growth layer 30 is thickened to have the same thickness without reducing stress, the second growth layer 40 is less likely to be cracked or broken.

Therefore, according to the method of manufacturing a group III nitride semiconductor substrate of the present embodiment, a group III nitride semiconductor having a semipolar plane as a main surface and having a sufficient aperture can be grown to a thick film. As a result, a bulk crystal including the first growth layer 30 and the second growth layer 40 is obtained. For example, the film thickness of the second growth layer 40 is 500 μm or more and 20 mm or less, and the maximum diameter is ϕ50 mm or more and ϕ6 inches or less. The film thickness of the first growth layer 30 is 100 μm or more and 10 mm or less. In a case where the first growth layer 30 and the second growth layer 40 are combined, the film thickness is 600 μm or more and 30 mm or less. The surface of the second growth layer 40 is uneven, and there is an m-plane facet.

According to the present embodiment in which a bulk crystal having a sufficient diameter and a sufficient film thickness can be manufactured as described above, a group III nitride semiconductor substrate having a semipolar plane as a main surface and having a sufficient diameter and thickness can be efficiently manufactured by cutting out a part (group III nitride semiconductor layer) from the bulk crystal (separation step S14). For example, the maximum diameter of the group III nitride semiconductor layer is ϕ50 mm or more and ϕ6 inches or less, and the thickness of the group III nitride semiconductor layer is 100 μm or more and 10 mm or less.

In a case where the stress is reduced, the crack 31 is generated in the first growth layer 30. Then, the second growth layer 40 grown over such a first growth layer 30 is formed by bonding crystals grown from the first surface region and the second surface region of the first growth layer 30 that are separated from each other with the crack 31 as a boundary. Here, dislocation may occur on the interface between the first surface region and the second surface region. Then, in a case where there is a plane orientation deviation between the first surface region and the second surface region, dislocation on the interface increases. In the present embodiment, the first growth layer 30 is held from the outer periphery by the annular polycrystalline group III nitride semiconductor. Therefore, the deviation of the plane orientation can be suppressed. As a result, a dislocation increase on the interface can be suppressed.

According to the method of manufacturing a group III nitride semiconductor substrate of the present embodiment in which the first growth step S11 and the cooling step S12 are performed in a state in which the base substrate 10 is restrained by the susceptor 20, it is possible to reduce the number of cracks 31 generated in the first growth layer 30 compared with a case where the same processing is performed without the restraint.

In addition, according to the method of manufacturing a group III nitride semiconductor substrate of the present embodiment in which the second growth step S13 is performed in a state in which the laminate including the base substrate 10 and the first growth layer 30 is restrained by the susceptor 20, the number of cracks generated in the first growth layer 30 or the second growth layer 40 can be reduced and separation can be suppressed compared with a case where the same processing is performed without the restraint.

As described above, according to the method of manufacturing a group III nitride semiconductor substrate of the present embodiment, a group III nitride semiconductor substrate having a semipolar plane as a main surface and having a large aperture is realized.

In addition, according to the method of manufacturing a group III nitride semiconductor substrate of the present embodiment, as shown in FIGS. 4-1 and 4-2, it is possible to manufacture a group III nitride semiconductor substrate 50 having a group III nitride semiconductor layer including a first portion 51 formed of single crystals and a second portion 52 formed of polycrystals. FIGS. 4-1 and 4-2 are plan views of the group III nitride semiconductor substrate 50, and show the main surface.

The second portion 52 is attached to the outer periphery of the first portion 51. The second portion 52 has an annular shape, and holds the first portion 51 thereinside. The second portion 52 may be in a state of being randomly attached as shown in FIG. 4-1 or may be arranged by polishing, grinding, or the like as shown in FIG. 4-2.

According to the group III nitride semiconductor substrate 50 of the present embodiment, the diameter can be increased by the second portion 52. As a result, handleability or workability can be improved. In addition, in a case where the group III nitride semiconductor substrate 50 is used as a seed substrate, a large growth area of the first portion 51 formed of single crystals can be secured. For example, the maximum diameter of the first portion 51 is ϕ50 mm or more and ϕ6 inches or less, and the maximum diameter of the group III nitride semiconductor layer having the first portion 51 and the second portion 52 is ϕ51 mm or more and ϕ6.5 inches or less.

Figures 3, 4, 5:
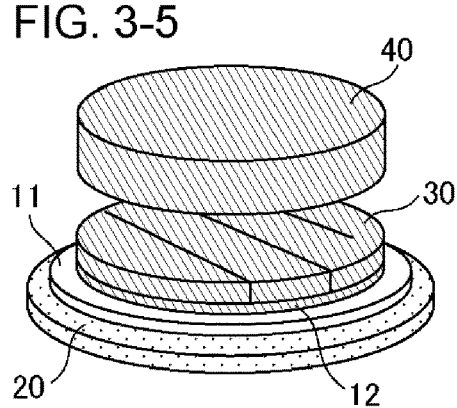
FIG. 5 is a schematic diagram for explaining the characteristics of the group III nitride semiconductor substrate of the present embodiment.
Figures 1, 4:
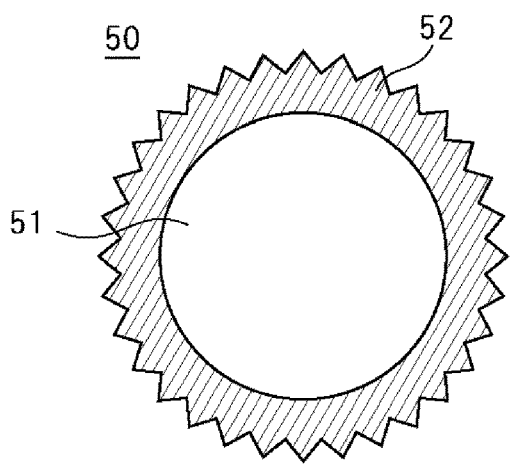
Figures 2, 4:
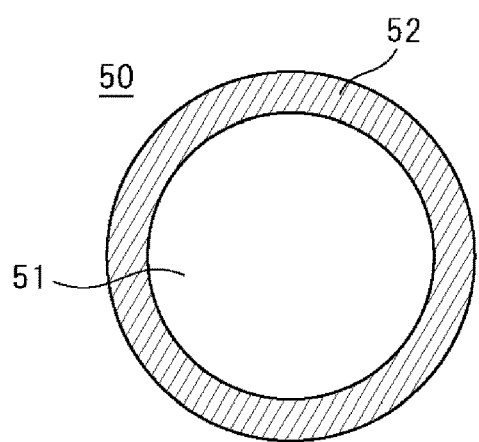
Figure 5:
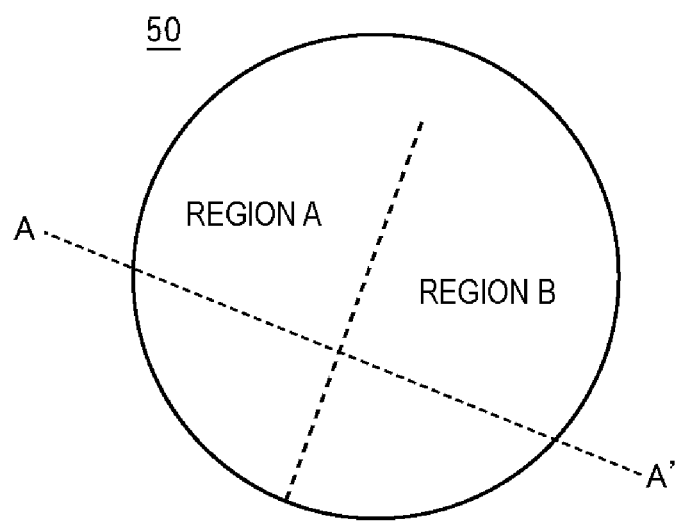
Figure 6:
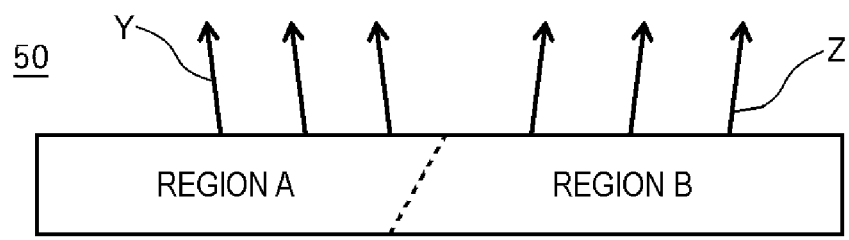
FIG. 6 is a schematic diagram for explaining the characteristics of the group III nitride semiconductor substrate of the present embodiment.

In addition, according to the method of manufacturing a group III nitride semiconductor substrate of the present embodiment, as shown in FIGS. 5 and 6, the group III nitride semiconductor substrate 50 having a group III nitride semiconductor layer including plural portions having different crystal axis directions is manufactured. FIG. 6 is a cross-sectional view taken along the line A-A' of FIG. 5. A region A and a region B shown in the diagram are portions grown from the first surface region and the second surface region of the first growth layer 30 that are separated from each other with the crack 31 as a boundary.

Crystals in the region A and the region B have different crystal axis directions due to the deviation of the crystal axis (deviation due to the crack 31) between the first surface region and the second surface region of the first growth layer 30 and the like. The direction Y of the crystal axis of the region A shown in the diagram and the direction Z of the crystal axis of the region B shown in the diagram indicate the same direction of the crystal axis. This feature is a feature that appears in the group III nitride semiconductor substrate 50 manufactured by the method of manufacturing a group III nitride semiconductor substrate of the present embodiment. As described above, in the present embodiment, the deviation of the plane orientation can be suppressed by the presence of the annular polycrystalline group III nitride semiconductor that holds the first growth layer 30 from the outer periphery. As a result, the angle between the direction Y of the crystal axis of the region A and the direction Z of the crystal axis of the region B can be suppressed to 2° or less.

In addition, according to the method of manufacturing a group III nitride semiconductor substrate of the present embodiment, the group III nitride semiconductor substrate 50 including a part or all of the first growth layer 30 formed in the first growth step S11 and a part or all of the second growth layer 40 formed in the second growth step S13 can be manufactured by adjusting the separation method in the separation step S14.

The group III nitride semiconductor substrate 50 is in a state in which a part or all of the first growth layer 30 and a part or all of the second growth layer 40 are laminated. Then, the interface between the first growth layer 30 and the second growth layer 40 is uneven, and there is an m-plane facet at the interface. This feature is a feature that appears in the group III nitride semiconductor substrate 50 manufactured by the method of manufacturing a group III nitride semiconductor substrate of the present embodiment.

In addition, according to the method of manufacturing a group III nitride semiconductor substrate of the present embodiment, the group III nitride semiconductor substrate 50 having a feature of the surface of the second growth layer 40 can be obtained by cutting out the group III nitride semiconductor substrate 50 while leaving the surface of the second growth layer 40 in the separation step S14. As described above, the surface of the second growth layer 40 is uneven, and there is an m-plane facet. Therefore, the surface of the group III nitride semiconductor substrate 50 is also uneven, and there is an m-plane facet.

EXAMPLE

Next, an example is shown. First, the base substrate 10 was prepared in which the group III nitride semiconductor layer (GaN layer) 12 was formed over the sapphire substrate 11, which had a diameter of φ4 inches and in which the plane orientation of the main surface was an m-plane, with a buffer layer interposed therebetween using the MOCVD. The plane orientation of the main surface of the group III nitride semiconductor layer 12 was (−1-12-3), the maximum diameter was φ4 inches, and the thickness was 15 μm.

Figure 7:
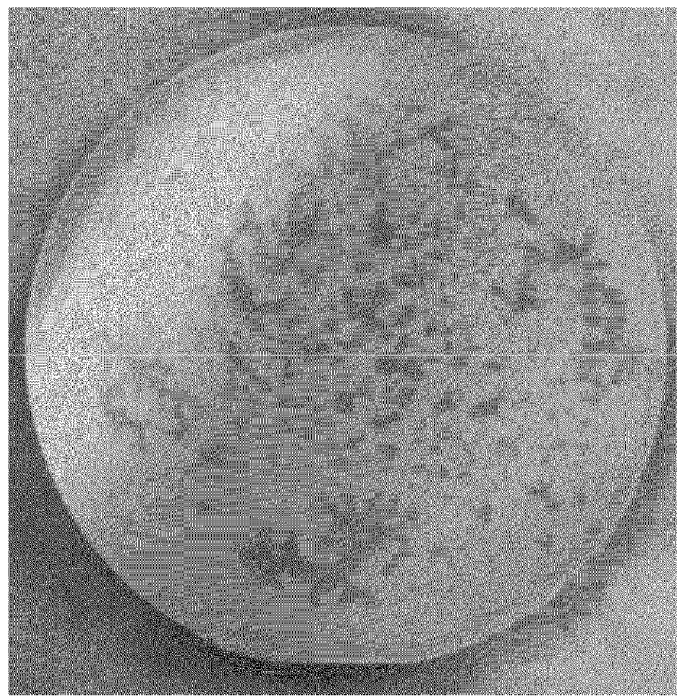
FIG. 7 is an image of an example of a structure obtained by the method of manufacturing a group III nitride semiconductor substrate of the present embodiment.

Then, the base substrate 10 was fixed to a carbon susceptor (susceptor 20) (fixing step S10). Specifically, the bottom surface of the sapphire substrate 11 was bonded to the main surface of the carbon susceptor using an alumina based adhesive. FIG. 7 shows a state in which the base substrate 10 fixed to the carbon susceptor was observed from the side of the group III nitride semiconductor layer 12.

Then, in a state in which the base substrate 10 was fixed to the carbon susceptor, group III nitride semiconductor (GaN) was grown over the main surface of the group III nitride semiconductor layer 12 using the HVPE method (first growth step S11). As a result, the first growth layer (GaN layer) 30 formed of single crystal group III nitride semiconductor was formed. The growth conditions are as follows.

Growth temperature: 1040° C.

Growth time: 15 hours

V/III ratio: 10

Growth film thickness: 4.4 mm

Figure 8:
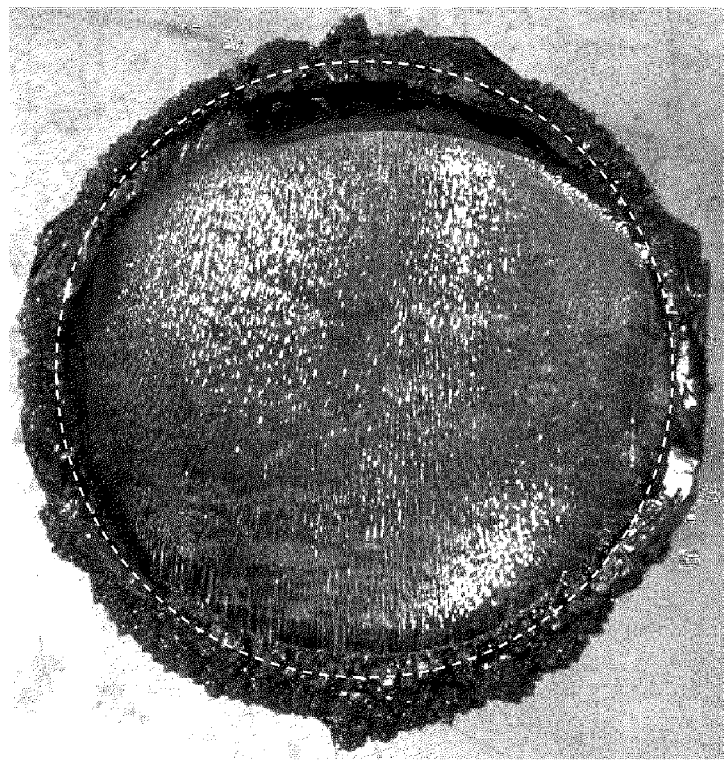
FIG. 8 is an image of an example of a structure obtained by the method of manufacturing a group III nitride semiconductor substrate of the present embodiment.

Then, a laminate including the carbon susceptor, the base substrate 10, and the first growth layer 30 was taken out from the HVPE apparatus and cooled to the room temperature (cooling step S12). FIG. 8 shows a state in which the laminate after cooling was observed from the side of the first growth layer 30. It can be seen that polycrystalline group III nitride semiconductors were attached along the outer periphery, these were connected to each other to form an annular shape, and the laminate was held thereinside. A white dotted line is added to the image in order to indicate the position of the base substrate 10. Although it is difficult to understand in the diagram, the crack 31 was present on the surface of the first growth layer 30. The presence of the crack 31 is separately shown.

Then, in a state in which the base substrate 10 was fixed to the carbon susceptor and the polycrystalline group III nitride semiconductor remained, group III nitride semiconductor (GaN) was grown over the main surface of the first growth layer 30 with the crack 31 using the HVPE method (second growth step S13). As a result, the second growth layer (GaN layer) 40 formed of single crystal group III nitride semiconductor was formed. The growth conditions are as follows.

Growth temperature: 1040° C.

Growth time: 14 hours

V/III ratio: 10

Growth film thickness: 3.0 mm (total film thickness of the first growth layer 30 and the second growth layer 40 is 7.4 mm).

Figure 9:
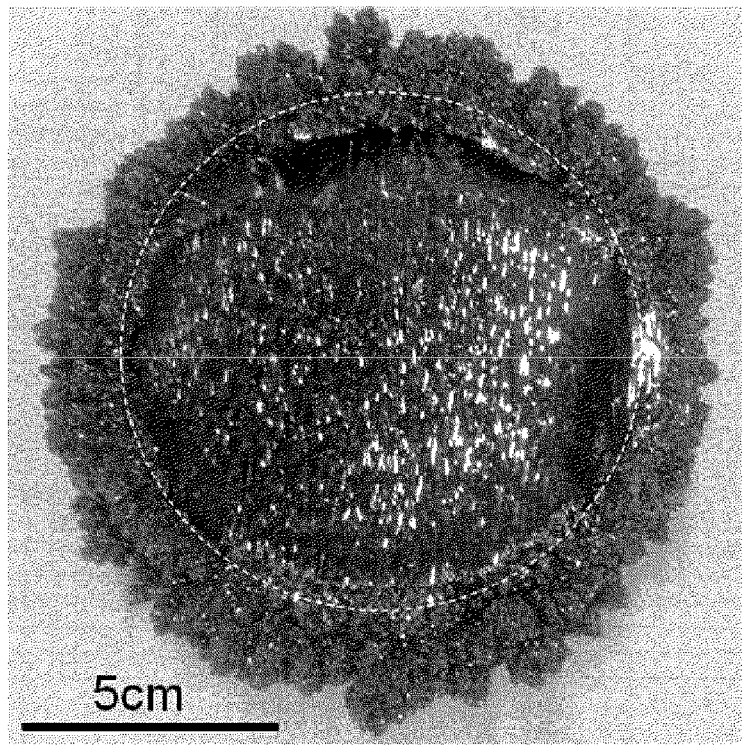
FIG. 9 is an image of an example of a structure obtained by the method of manufacturing a group III nitride semiconductor substrate of the present embodiment.
Figure 12:
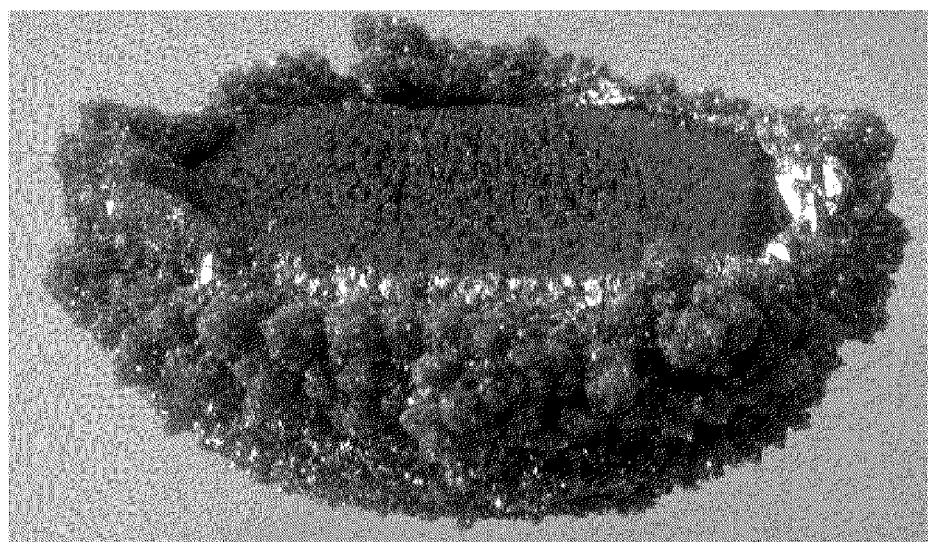
FIG. 12 is an image of an example of a structure obtained by the method of manufacturing a group III nitride semiconductor substrate of the present embodiment.

FIG. 9 shows a state in which the laminate including the carbon susceptor, the base substrate 10, the first growth layer 30, and the second growth layer 40 was observed from the side of the second growth layer 40. FIG. 12 shows a state in which the laminate was observed from the diagonally upward direction.

It can be seen that polycrystalline group III nitride semiconductors were attached along the outer periphery, these were connected to each other to form an annular shape, and the laminate was held thereinside. In addition, it can be seen that the amount of polycrystalline group III nitride semiconductor increases compared with FIG. 8. In addition, it can be seen that the polycrystalline group III nitride semiconductor is connected up to the bottom surface side of the laminate to form a cup shape, and the laminate is held thereinside. Although not shown, even after the first growth step S11, as shown in FIG. 12, the polycrystalline group III nitride semiconductor had a cup shape, and the laminate was held thereinside.

The maximum diameter of the second growth layer 40 was about φ4 inches. In addition, the maximum diameter of a surface including the second growth layer 40 and the polycrystalline group III nitride semiconductor along the outer periphery thereof was about 130 mm. In addition, cracking did not occur in the second growth layer 40.

Figure 10:
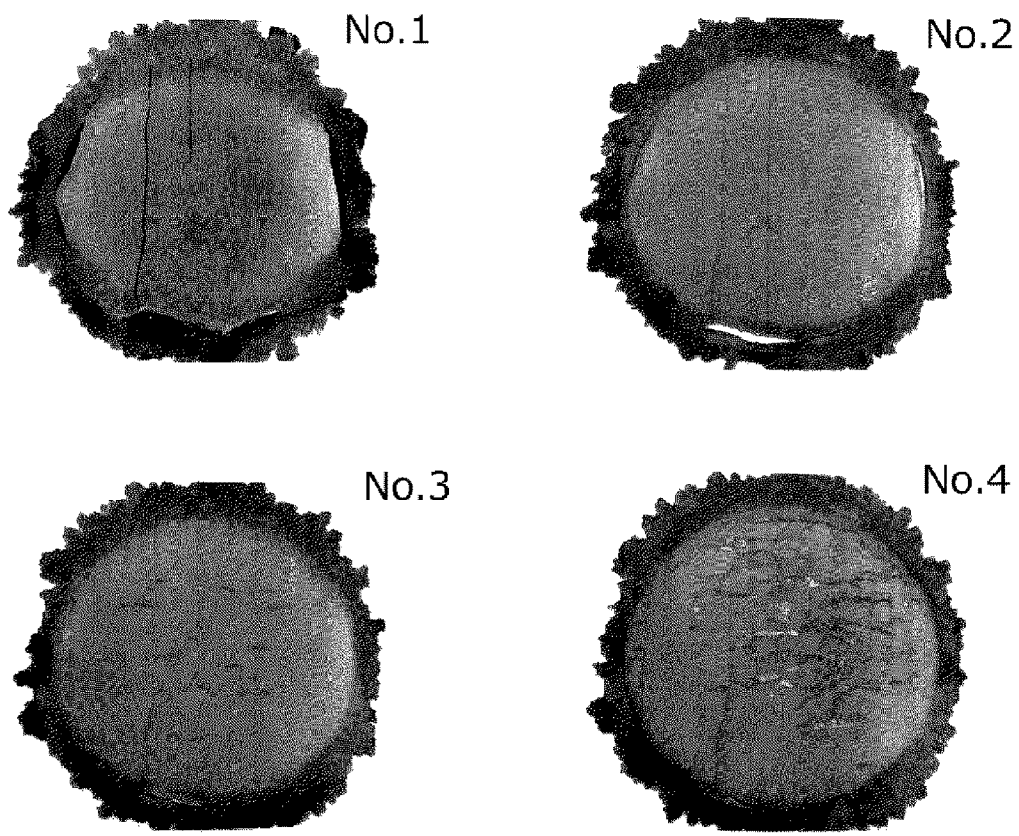
FIG. 10 is an image of an example of a structure obtained by the method of manufacturing a group III nitride semiconductor substrate of the present embodiment.

Then, the second growth layer 40 was sliced, and plural group III nitride semiconductor substrates 50 were taken out. FIG. 10 shows a state in which each of the plural group III nitride semiconductor substrates 50 taken out was observed from the main surface (semipolar plane) side. "No. 4" is the group III nitride semiconductor substrate 50 taken out from the side closest to the first growth layer 30, and the distance from the first growth layer 30 increases in order of No. 3, No. 2, and No. 1. It can be seen that the above bonding line (crack) is present in the vertical direction in the diagram. In addition, when No. 1 to No. 4 are observed, it can be seen that the bonding line decreases or becomes small as the distance from the first growth layer 30 increases. In No. 1, in order to clarify a crack, processing of drawing a line along a crack is performed.

Figure 11:
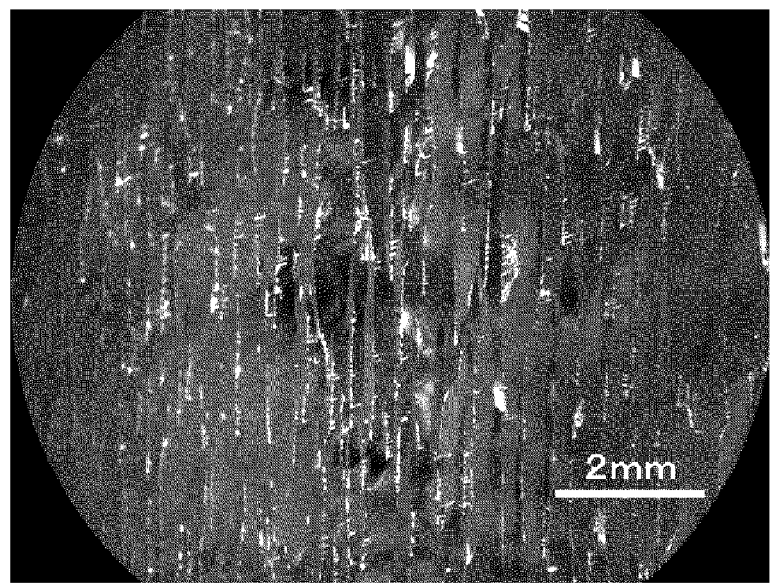
FIG. 11 is an image obtained by observing the surface of a first growth layer with a stereomicroscope.

Next, FIG. 11 shows a state in which the surface of the first growth layer 30 was observed with a stereomicroscope after the cooling step S12. The diagram shows plural irregularities extending upward from the bottom of the diagram. Among plural exposed surfaces of irregularities, the side surface extending upward from the bottom in the diagram is a facet plane formed of an m-plane facet (a facet of plane orientation formed in a range of 0 to ±90° in the c-axis direction from the m-plane) mainly including a (0–11–2) plane and a (–101–2) plane. From the image, it was possible to confirm that there was an m-plane facet on the surface of the first growth layer 30, that is, there was an m-plane facet at the interface between the first growth layer 30 and the second growth layer 40.

Hereinafter, examples of reference forms are additionally described.

1. A method of manufacturing a group III nitride semiconductor substrate including: a fixing step of fixing a base substrate, which includes a group III nitride semiconductor layer having a semipolar plane as a main surface, to a susceptor; a first growth step of forming a first growth layer by growing a group III nitride semiconductor over the main surface of the group III nitride semiconductor layer in a state in which the base substrate is fixed to the susceptor using a hydride vapor phase epitaxy (HVPE) method; a cooling step of cooling a laminate including the susceptor, the base substrate, and the first growth layer after the first growth step; and a second growth step of forming a second growth layer by growing a group III nitride semiconductor over the first growth layer in a state in which the base substrate is fixed to the susceptor using the HVPE method after the cooling step.

2. The method of manufacturing a group III nitride semiconductor substrate according to 1, further including: a separation step of separating a group III nitride semiconductor substrate having at least one of the first growth layer or the second growth layer from the susceptor after the second growth step.

3. The method of manufacturing a group III nitride semiconductor substrate according to 1 or 2, in which a crack is present in the first growth layer after the cooling step, and in the second growth step, the second growth layer is formed by growing a group III nitride semiconductor over a surface of the first growth layer in which a crack is present using the HVPE method.

4. The method of manufacturing a group III nitride semiconductor substrate according to any one of 1 to 3, in which, in the fixing step, the base substrate is fixed to the susceptor using an adhesive.

5. The method of manufacturing a group III nitride semiconductor substrate according to any one of 1 to 4, in which, in the first growth step, an annular polycrystalline group III nitride semiconductor is formed along a side surface of a laminate including the susceptor, the base substrate, and the first growth layer, and in the second growth step, the second growth layer is formed over the first growth layer in a state in which the annular polycrystalline group III nitride semiconductor remains.

6. The method of manufacturing a group III nitride semiconductor substrate according to any one of 1 to 5, in which the base substrate includes a sapphire substrate and the group III nitride semiconductor layer.

7. A group III nitride semiconductor substrate including a group III nitride semiconductor layer having a semipolar plane as a main surface, in which a maximum diameter of the group III nitride semiconductor layer is ϕ50 mm or more, and a thickness of the group III nitride semiconductor layer is 100 μm or more.

8. The group III nitride semiconductor substrate according to 7, in which the group III nitride semiconductor layer includes plural portions having different crystal axis directions.

9. The group III nitride semiconductor substrate according to 7 or 8, in which the group III nitride semiconductor layer has a first portion formed of single crystals and a second portion formed of polycrystals and attached to an outer periphery of the first portion.

10. The group III nitride semiconductor substrate according to any one of 7 to 9, in which, in the group III nitride semiconductor layer, a first group III nitride semiconductor layer and a second group III nitride semiconductor layer are laminated, and an interface between the first group III nitride semiconductor layer and the second group III nitride semiconductor layer is uneven and there is an m-plane facet at the interface.

11. The group III nitride semiconductor substrate according to any one of 7 to 9, in which a surface of the group III nitride semiconductor layer is uneven, and there is an m-plane facet on the surface.

12. A bulk crystal including a layer that is formed of single crystals of a group III nitride semiconductor, has a semipolar plane as a main surface, and has a maximum diameter of ϕ50 mm or more and a thickness of 600 μm or more.

This application claims priority based on Japanese Patent Application No. 2017-062361 filed on Mar. 28, 2017, the entire disclosure of which is incorporated herein.

The invention claimed is:

1. A group III nitride semiconductor substrate, comprising: a group III nitride semiconductor layer including a first portion formed of single crystals and a second portion formed of polycrystals and annularly attached to an outer periphery of the first portion, the group III nitride semiconductor layer having a semipolar plane as a main surface,
wherein a maximum diameter of the group III nitride semiconductor layer is ϕ4 inches or more, and a thickness of the group III nitride semiconductor layer is 100 μm or more.

2. The group III nitride semiconductor substrate according to claim 1,
wherein the group III nitride semiconductor layer comprises a plurality of portions having different crystal axis directions.

3. The group III nitride semiconductor substrate according to claim 1,
wherein, in the group III nitride semiconductor layer, a first group III nitride semiconductor layer and a second group III nitride semiconductor layer are laminated, and
an interface between the first group III nitride semiconductor layer and the second group III nitride semiconductor layer is uneven, and there is an m-plane facet at the interface.

4. The group III nitride semiconductor substrate according to claim 1,
wherein a surface of the group III nitride semiconductor layer is uneven, and there is an m-plane facet on the surface.

5. A bulk crystal, comprising: a layer that includes a first portion formed of single crystals of a group III nitride semiconductor and a second portion formed of polycrystals of the group III nitride semiconductor and annularly attached to an outer periphery of the first portion, has a semipolar plane as a main surface, and has a maximum diameter of ϕ4 inches or more and a thickness of 600 μm or more.

* * * * *